United States Patent [19]

Schweizer et al.

[11] Patent Number: 5,077,004

[45] Date of Patent: Dec. 31, 1991

[54] SINGLE CRYSTAL NICKEL-BASE SUPERALLOY FOR TURBINE COMPONENTS

[75] Inventors: Frederick A. Schweizer, New Hartford, N.Y.; Xuan Nguyen-Dinh, Scottsdale, Ariz.

[73] Assignee: Allied-Signal Inc., Morris Township, N.J.

[21] Appl. No.: 860,600

[22] Filed: May 7, 1986

[51] Int. Cl.$^5$ ............................................. C22C 19/05
[52] U.S. Cl. ................................. 420/448; 148/162; 148/404; 148/428; 420/447
[58] Field of Search ................. 148/404; 420/447, 448

[56] References Cited

U.S. PATENT DOCUMENTS

| | | | |
|---|---|---|---|
| 3,026,198 | 3/1962 | Thielemann | 420/448 |
| 3,494,709 | 2/1970 | Piearcey | 416/236 |
| 3,615,376 | 10/1971 | Ross | 420/449 |
| 3,677,835 | 7/1972 | Tien et al. | 148/404 |
| 3,756,809 | 9/1973 | Asgar | 420/588 |
| 4,045,255 | 8/1977 | Jackson | 148/404 |
| 4,058,415 | 11/1977 | Walter | 148/404 |
| 4,092,183 | 5/1978 | Grundy | 148/404 |
| 4,116,723 | 9/1978 | Gell et al. | 148/162 |
| 4,169,742 | 10/1979 | Wukusick et al. | 148/404 |
| 4,207,098 | 6/1980 | Shaw | 420/448 |
| 4,209,348 | 6/1980 | Duhl et al. | 148/162 |
| 4,222,794 | 9/1980 | Schweizer et al. | 420/448 |
| 4,402,772 | 9/1985 | Duhl et al. | 148/404 |
| 4,582,548 | 4/1986 | Harris et al. | 148/404 |
| 4,583,608 | 4/1986 | Field et al. | 148/404 |
| 4,643,782 | 2/1987 | Harris et al. | 148/410 |
| 4,677,035 | 6/1987 | Fiedler et al. | 420/448 |
| 4,719,080 | 1/1988 | Duhl et al. | 420/448 |

*Primary Examiner*—Stephen J. Lechert, Jr.
*Attorney, Agent, or Firm*—Donald W. Canady; R. Steven Linne; Robert A. Walsh

[57] ABSTRACT

A single crystal nickel-base superalloy is disclosed having an improved incipient melting temperature and oxidation resistance. The single crystal nickel-base alloy of this invention is characterized by specific addition of chromium, tungsten, aluminum and tantalum to produce an alloy having moderate high temperature strength and improved oxidation resistance and incipient melting temperature. The nominal composition of our new single crystal alloy (in weight percent) is 10-15% Cr, 0-4% Co, 6-8.5% W, 6-7% Al, 0-1% Ti, 2-6% Ta, and the balance nickel.

12 Claims, 1 Drawing Sheet

SINGLE CRYSTAL NICKEL-BASE SUPERALLOY FOR TURBINE COMPONENTS

BACKGROUND OF THE INVENTION

Nickel-base cast alloys have been used extensively to turbine parts and component designs requiring high temperature strength and corrosion resistance, for service at temperatures in excess of 1400° F. Single crystal casting techniques have been developed for the manufacture of gas turbine blades and vanes and permit alloy compositions to be further optimized for high temperature strength by removal of grain strengthening elements such as carbon, boron and zirconium, which adversely affect heat treatability. The primary strengthening mechanism of nickel base super alloys cast in single crystal components, is the formation of the intermetallic gamma prime phase, $Ni_3$ (Al, Ti). The stress-rupture life of such single crystal components, is a function of the volume fraction of fine gamma prime particles in the microstructure. Removal of grain boundary strengthening elements such as B, Zr, Hf, and C (which are also melting point depressants) resulted in an increase in the incipient melting temperatures from about 2250° F. to about 2400° F.

There is generally a 200°-300° F. difference in the temperatures to which turbine blades and stationary turbine vanes are subjected. While turbine blades are under higher stress, the stationary vanes are subjected to higher temperatures. Accordingly, it is desirable to develop a vane or turbine nozzle alloy which is more temperature resistant, i.e. has a higher incipient melting point, with less demanding high temperature strength properties.

Since the turbine vanes are subjected to higher temperatures, at which oxidation is accelerated, the oxidation resistance of turbine vane alloys must be improved, relative to blade materials.

It is therefore an object of our present invention to provide a single crystal nickel-base alloy article having a combination of improved incipient melting temperature and oxidation resistance. This and other objects are realized by our present invention as will be appreciated from the following description of the invention.

DISCUSSION OF THE PRIOR ART

The most seemingly pertinent patents located in the prior art relating to the present nickel-base super-alloys are U.S. Pat. Nos. 3,026,198 Thielemann; 3,494,709 Piearcey; 3,677,835 Tien et al; 3,888,363 Smashey et al; 4,116,723 Gell et al; 4,209,348 Duhl et al; and 4,222,794 Schweizer et al.

The Thielemann patent contains chromium, cobalt, aluminum, titanium and tantalum, as does our present alloy, however, the Thielemann patent contains 20-35% tungsten which would promote substantial sigma or other brittle intermetallic phases formation and thus produce a more brittle alloy than would be desirable in the present application. This tungsten content would also result in an undesirably high density superalloy.

The Piearcey patent does not contain Tantalum which is important as a gamma prime forming element and provides both strength and oxidation resistance in the alloy of our present invention.

The Tien et al patent contains grain boundary strengthening elements such as Zirconium, hafnium and carbon which are detrimental to our present alloy in the amounts shown, since they are melting point depressants and would not permit the increase in the incipient melting temperature of our present alloy.

The Smashey et al patent discloses a nickel-base superalloy addressed to the improvement of stress-rupture and creep properties in a unidirectionally solidified cast article, characterized by the substantial absence of titanium. This alloy also has up to 7% vanadium. In the alloy of our present invention, titanium is employed as a gamma prime forming element, and vanadium is eliminated to enhance hot corrosion resistance.

The Gell et al patent, discloses a nickel-base superalloy single crystal material which contains molybdenum and rhenium. Molybdenum would be detrimental to the environmental resistance requirements of the alloys of our present invention, and the expensive alloying element, rhenium, is not required to meet the strength objectives of the alloy of our present invention.

U.S. Pat. No. 4,209,348 is also a nickel-base superalloy single crystal material which contains 3-7% cobalt, lower aluminum (4.5-5%) and tungsten (3-5%) with more tantalum (10-14%) but is essentially free of molybdenum. The aluminum level of our present alloy is necessary for oxidation resistance and strength.

U.S. Pat. No. 4,222,794 describes an alloy having zero to 7% cobalt, 0.8 to 1.5% titanium and 0.2-0.6% vanadium. The 0.2-0.6% vanadium, has been found to degrade hot corrosion resistance in the alloy of our present invention.

The alloy composition range described in U.S. Pat. No. 4,222,794 is also unstable with respect to precipitation of sigma phase, which will probably degrade strength after prolonged high temperature exposure.

SUMMARY OF THE INVENTION

Our present invention is an improved single crystal nickel-base super alloy which has been found to have a superior incipient melting temperature and coated oxidation resistance. The incipient melting temperature of our new alloy is improved to at least 2450° F., which is comparable to incipient melting temperatures of under 2400° F. for other nozzle vane alloys.

In accordance with out present invention, the single crystal nickel-base superalloy composition is modified by eliminating molybdenum and holding the chromium to a narrow range in a gamma prime phase strengthened nickel-base alloy containing aluminum, tungsten and tantalum.

Chromium has a beneficial effect on the incipient melting temperature, however, it has been found that below about 7% chromium, corrosion resistance decreases significantly. The strength level obtained by our present alloy is on the order of the directionally solidified MAR-M-247 superalloy.

Cobalt is not critical to our present alloy; however, it may be substituted in the amounts of 0-4% for nickel. Cobalt inhibits the sigma phase formation, but the gamma prime strengthened alloys are inherently sigma phase free unless the solubility of the gamma matrix is exceeded.

Molybdenum is eliminated from our present alloy since it has been found to be detrimental to hot corrosion resistance and is not necessary in our present alloy to meet the strength objectives.

Tungsten is added to our present alloy for strength, however, tungsten above about 10% will likely cause sigma phase formation. Excess tungsten also increases the alloy's density.

Aluminum is present in our present alloy for gamma prime formation and also enhances the oxidation resistance of the alloy.

Tantalum is an important ingredient in our alloy as a gamma prime forming element, and also it enhances strength and oxidation resistance. However, tantalum in excessive of 6% increases the cost and alloy density.

The enhancement of coated oxidation resistance is an important feature of our present alloy. Small additions of hafnium or yttrium may be added to enhance coated oxidation resistance by promoting oxide scale adhesion. The protective coating of co-pending application Ser. No. 509,284, now U.S. Pat. No. 4,743,514 of Strangman et al, assigned to the assignee of the present application, is an example of a protective coating used for single crystal turbine blades and vanes and is referred to herein as the SCC103 coating. Other coating such as the diffusion aluminides or platinum aluminides may also be employed on the alloys of the present invention.

DESCRIPTION OF THE PREFERRED EMBODIMENTS

Figure 1:
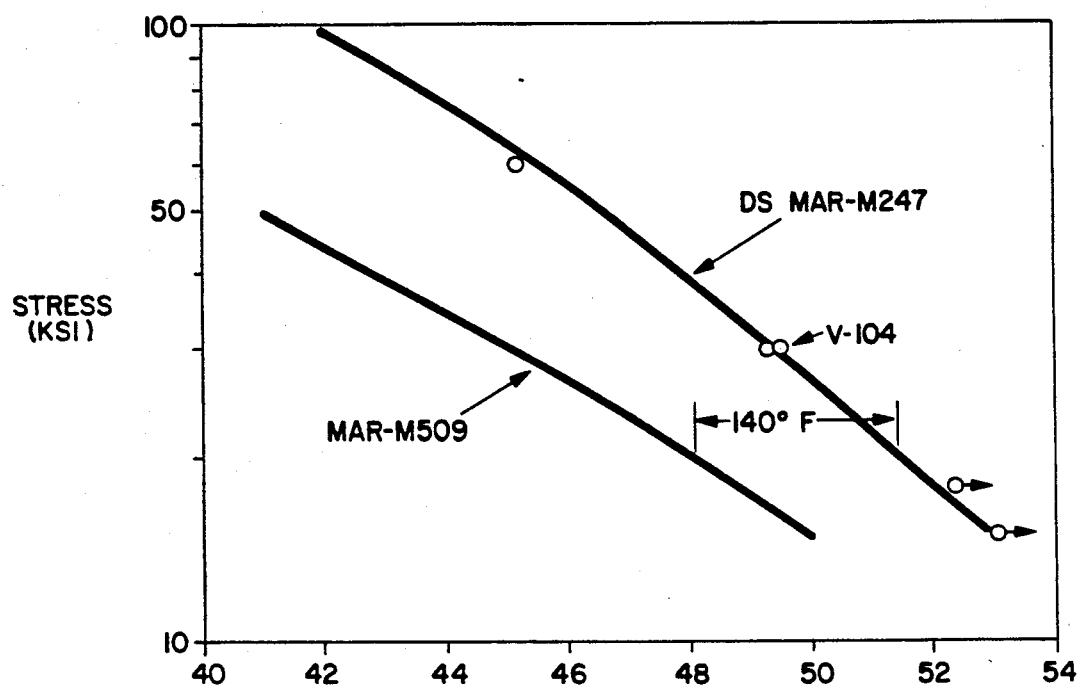
FIG. 1 is a graph illustrating the relationship between the stress and strength of certain alloys including the present invention.

In accordance with the present invention the composition of the nickel-base single crystal alloy is modified to obtain significant improvement in coated oxidation resistance and incipient melting temperature. The composition (in weight percent) of our new alloy is 10-15% chromium, 0-4% cobalt, 6-7% aluminum, 0-1% titanium, 6-8.5% tungsten, 2-6% tantalum, the remainder substantially all nickel. Molybdenum and vanadium are eliminated from the composition of the present alloy and would be present only as impurities. The preferred composition of the present alloy V-104 is shown in Table I.

TABLE I

CHEMICAL COMPOSITION (WEIGHT PERCENT) - ALLOY V-104

| Element | RANGE |
| --- | --- |
| Cr | 9.5–10.5 |
| W | 7.2–7.9 |
| Al | 5.8–6.2 |
| Ta | 5.8–6.2 |
| Hf | 0.08 max |
| Fe | 0.10 max |
| Cb | 0.15 max |
| V | 0.10 max |
| C | 0.006 max |
| Zr | 0.0075 max |
| Boron | 0.002 max |
| Cu | 0.05 max |
| P | 0.005 max |
| Mn | 0.02 max |
| Mg | 0.008 max |
| Ag | 5 ppm max |
| Si | 0.04 max |
| S | 0.002 max |
| Ni | Remainder |
| (O) | 10 ppm max |
| (N) | 12 ppm max |

In accordance with the present invention a heat of superalloy was drop cast and single crystal turbine vanes were cast in accordance with a commercial prior art withdrawal single crystal casting or solidification technique.

Following solidification to the preferred primary crystallographic orientation (e.g. [001]), the cast components were heat treated by conventional single crystal heat treatment, e.g. solution or homogenization heat treatment to a temperature between the gamma prime solvus and the incipient melting temperature, (i.e. 2400° F. for 3 hours) followed by a simulated coating process post-heat treatment (e.g. heating to 1950° F. for 4 hours) and precipitation heat treatment (e.g. 1600° F. for approximately 20 hours) to precipitate all of the remaining gamma phase out of solution, followed by air cooling.

EXAMPLES

Ten nickel-based alloys embodying the present invention were drop cast and their incipient melting temperatures determined. The alloy compositions and the incipient melting temperatures are given in Table II. A comparison of the incipient melting temperature of the present invention with other single crystal high temperature alloys is given in Table III, and the marked improvement in the incipient melting temperature of the alloys of the present invention is apparent. It will be noted that the incipient melting temperature for our alloy V-104 given in Table II is higher than the incipient melting temperature given for alloy V-104 in Table III, since the material of Table II is drop-cast without directional solidification and therefore the resulting alloy is more homogeneous with more composition uniformity, which results in the higher incipient melting temperature, as noted. Directional solidification, on the other hand, results in the segregation of solute elements from one area to the next, especially in the eutectic area, which lowers the incipient melting temperature.

TABLE II

ANALYZED CHEMISTRY OF DROP CAST ALLOYS EVALUATED (WEIGHT PERCENT)

| Alloy | Cr | Co | Mo | W | Al | Ta | Ni | Incip. Melting Temp. |
| --- | --- | --- | --- | --- | --- | --- | --- | --- |
| V101 | 10.2 | — | — | 7.1 | 6.4 | 4.8 | Bal. | 2500° F. |
| V102 | 10.2 | 2.1 | — | 7.4 | 6.0 | 4.6 | Bal. | 2500° |
| V103 | 10.5 | 4.3 | — | 7.4 | 5.6 | 4.0 | Bal. | 2500° |
| V104 | 10.3 | — | — | 7.5 | 5.6 | 6.2 | Bal. | 2500° |
| V105 | 10.8 | — | — | 7.5 | 6.1 | 2.7 | Bal. | 2500° |
| V106 | 15.5 | — | — | 6.4 | 6.0 | 4.4 | Bal. | 2450° |
| V107 | 15.0 | 2.1 | — | 7.3 | 6.0 | 4.1 | Bal. | 2425–2450° |
| V108 | 13.2 | 4.0 | — | 8.1 | 5.8 | 4.1 | Bal. | 2500° |
| V109 | 15.5 | — | — | 6.5 | 5.7 | 4.3 | Bal. | 2500° |
| V110 | 15.1 | 4.0 | — | 7.4 | 5.9 | 3.9 | Bal. | 2425° |

TABLE III

| ALLOY | INCIPIENT MELTING TEMPERATURE |
| --- | --- |
| V-104 | 2475° F. |
| DSMAR-M247 | 2250 |
| MAR-M 509 | 2350 |
| CMSX-3 | 2400 |
| 454 | 2365 |

Single crystal articles were product with the V-104 composition using the withdrawal casting process. The withdrawal process is described in the ASM publication entitled "Super Alloys 1980—Proceedings of the 4th Symposium on Super Alloys" Tien et al.

The castings were then heat treated by a solution heat treatment by a solution of 2400° F. for 3 hours followed by a rapid cool, then given a simulated coating treatment of 1950° F. for 4 hours followed by rapid cool, and then finally heated at 1600° F. for 20 hours followed by air cooling.

The elevated temperature stress-rupture test results of the bar specimens tested are shown in Table IV.

As indicated in FIG. 1, the strength of the V-104 alloy is equivalent or superior to the high temperature strength of directionally solidified (DS) Mar-M 247 nickel-base and equiaxed cast Mar-M 509 cobalt base superalloys, respectively, which are used in the prior art for production turbine vane applications.

TABLE IV

| Specimen | Test Temperature (°F.) | Stress (ksi) | Rupture Time (hours) | % Elongation in 4D | (%) RA |
|---|---|---|---|---|---|
| 104-3A | 1600 | 60.0 | 90.8 | 15.7 | 37.7 |
| 104-3B | 1600 | 60.0 | 86.4 | 16.0 | 37.2 |
| 104-4A | 1800 | 30.0 | 81.5 | 16.2 | 39.5 |
| 104-4B | 1800 | 30.0 | 76.8 | 15.6 | 45.3 |
| 104-5B | 1900 | 18.0 | 344.6 | 10.1 | 22.4 |
| 104-5A | 1900 | 15.0 | 816.5* | — | — |

*Test terminated per instructions in time indicated. No failure.

Tensile tests on the above test alloys, made in accordance with the present invention, at 1400° and 1800° F. are shown in Table V. These tests were performed with 0.070 inch diameter bar specimens.

TABLE V

| Specimen | Test Temperature (°F.) | 0.2% Offset Yield Strength (Psi) | Ultimate Tensile Strength (Psi) | (%) Elongation in 4D | (%) RA |
|---|---|---|---|---|---|
| 104-1A | 1400 | 131,500 | 168,000 | 10.2 | 20.4 |
| 104-1B | 1400 | 142,100 | 173,100 | 8.1 | 11.6 |
| 104-2A | 1800 | 55,600 | 92,600 | 20.5 | 52.5 |
| 104-2B | 1800 | 58,800 | 94,800 | 30.0 | 53.6 |

Coated oxidation resistance of several single crystal alloys were conducted on 0.5 inch diameter cylindrical specimens coated with SCC 103 coating applied by the low pressure plasma spray process. The test cycle was 2200° F. for 57 minutes followed by a forced air cool blast for 3 minutes. The results are shown in Table VI. The results shown in Table VI indicate that the alloy of the present invention, V-104, exhibits superior coated oxidation resistance, as compared to prior art single crystal nozzle vane alloys.

TABLE VI
COATED OXIDATION RESISTANCE

| Alloy | Reference | Time (Hours) | Comment |
|---|---|---|---|
| SC 130 | U.S.P. #4,765,850 | 150 | Failed |
|  |  | 184 | Failed |
| V104 | This invention | 200 | No failure |
|  |  | 206 | No failure |
| CMSX-3 | Cannon Muskegon Alloy | 140 | Failed |
|  |  | 150 | Failed |

As can be seen from the above test results, the alloy of the present invention exhibits an improved incipient melting temperature (Tables II and III) and coated oxidation resistance (Table VI) and also shows good stress-rupture life (Table IV) and elevated temperature tensile strength (Table V).

While the present invention has been described herein with a certain degree of particularity in reference to certain specific alloy compositions which were formulated and tested, it is to be understood that the scope of the invention is not to be so limited, but should be afforded the full scope of the appended claims.

We claim:
1. A single crystal nickel-base superalloy article for use at elevated temperatures, characterized by having a stress-rupture life at 1800° F., and at 30 KSI stress load, in excess of 70 hours and having an incipient melting temperature of at least 2450° F., said alloy consisting essentially of the composition (in weight percent) of about: 9.5-15.5% Cr, 0-4.3% Co, 5.6-7% Al, 0-1% Ti, 6-8.5% W, 2-6.2% Ta, balance Ni plus impurities without intentional additions of molybdenum.

2. The article of claim 1 having 9.5-10.5% Cr, 7.2-7.9% W, 5.8-6.2% Al, 5.8-6.2% Ta, balance Ni plus impurities without intentional additions of Co, Mo, and Ti.

3. The article of claim 1 having satisfactory coated oxidation resistance for 200 hours following a cyclic heating to 2200° F. for approximately one hour followed by a 3 minute air cool blast.

4. The article of claim 1 having been subjected to the following heat treatment:
a) heating to about 2400° F. for 2 hours followed by rapid cooling,
b) holding at about 1950° F. for 4 hours followed by rapid cooling, and
c) holding at about 1600° F. for 20 hours followed by air cooling.

5. The alloy of claim 1 having about: 10.2 to 15.5% Cr, 0 to 2.1% Co, 6.4 to 8.1% W, 5.6 to 6.4% Al, 2.7 to 6.2 Ta, and the balance nickel plus impurities.

6. The article of claim 5 having the alloy composition of about: 10.3% Cr, 7.5% W, 5.6% Al, 6.2% Ta, balance Ni.

7. An improved molybdenum-free nickel base superalloy of the type having about 10 to 15% chromium where the improvement consists essentially of about: 6 to 7% aluminum, 6 to 8.5% tungsten, 2 to 6% tantalum, up to 4% cobalt, up to 1% titanium, the balance nickel plus normal impurities, and wherein said superalloy is further characterized by having an incipient melting temperature of at least about 2450° F.

8. A method for producing nickel base superalloy single crystal components for use at elevated temperatures, comprising the steps of:
a) providing a mass of nickel base superalloy material which is free from intentional additions of molybdenum and vanadium; and which consists essentially of about: 10 to 15% chromium, 6 to 7% aluminum, 6 to 8.5% tungsten, 2 to 6% tantalum, up to 4% cobalt, up to 1% titanium and the balance nickel plus impurities;
b) melting said mass and resolidifying the alloy under conditions of unidirectional heat flow so as to produce a single crystal article; said article having an incipient melting temperature of at least about 2450° F.; and
c) heat treating the article to solutionize and homogenize the microstructure.

9. The method of claim 8 further including the steps of:
d) coating the superalloy article for enhancement of oxidation resistance, and
e) heat-treating the coated article by heating to about 1950° F. for 4 hours followed by rapid cooling.

10. The article of claim 7 wherein the amount of cobalt is less than about 4.0 percent.

11. The article of claim 10 wherein the amount of cobalt is less than about 2.1 percent.

12. The article of claim 7 wherein the amount of titanium is substantially zero and the incipient melting temperature is about 2500° F.

* * * * *